United States Patent [19]

Damsker

[11] 4,395,582
[45] Jul. 26, 1983

[54] COMBINED SOLAR CONVERSION

[75] Inventor: Dorel J. Damsker, New York, N.Y.

[73] Assignee: Gibbs & Hill, Inc., New York, N.Y.

[21] Appl. No.: 24,791

[22] Filed: Mar. 28, 1979

[51] Int. Cl.³ .......................... H01L 31/04; F24J 3/02
[52] U.S. Cl. .................................... 136/248; 126/417; 136/257; 136/259
[58] Field of Search ........ 136/89 CA, 89 HY, 89 PC, 136/89 FC, 89 CL, 259, 248, 246, 247, 257; 126/270, 271, 417

[56]  References Cited
U.S. PATENT DOCUMENTS

| Re. 29,833 | 11/1978 | Mlavsky | 136/89 PC |
|---|---|---|---|
| 2,946,945 | 7/1960 | Regnier et al. | 320/2 |
| 3,076,861 | 2/1963 | Samulon | 136/89 |
| 3,743,847 | 7/1973 | Boland | 250/510 |
| 3,751,303 | 8/1973 | Kittl | 136/89 |
| 3,929,510 | 12/1975 | Kittl | 136/206 |
| 3,985,116 | 10/1976 | Kapany | 126/270 |
| 4,002,031 | 1/1977 | Bell | 60/641 |
| 4,069,812 | 1/1978 | O'Neill | 126/271 |
| 4,078,944 | 3/1978 | Mlavsky | 136/89 H |
| 4,097,309 | 6/1978 | Horne | 136/89 PC |
| 4,106,952 | 8/1978 | Kravitz | 136/89 HY |
| 4,110,123 | 8/1978 | Goetzberger et al. | 136/89 HY |
| 4,158,356 | 6/1979 | Wininger | 126/271 |
| 4,171,003 | 10/1979 | Forrat | 136/89 PC |
| 4,184,895 | 1/1980 | Oster, Jr. | 136/89 FC |
| 4,297,521 | 10/1981 | Johnson | 136/248 |

FOREIGN PATENT DOCUMENTS 2700767  7/1978  Fed. Rep. of Germany . 136/89 HY

OTHER PUBLICATIONS

M. A. Duguay, "Solar Electricity: The Hybrid System Approach", *American Scientist*, vol. 65, pp. 422–427, (1977).
A. Guetzberger et al., "Solar Energy Conversion with Fluorescent Collectors", *Appl. Phys.*, vol. 14, pp. 123–139, (1977).
A. D. Meinel et al., "Applied Solar Energy", Addison-Wesley Pub. Co., (1976), pp. 282–283.

*Primary Examiner*—Aaron Weisstuch
*Attorney, Agent, or Firm*—Pennie & Edmonds

[57]  ABSTRACT

A combined solar converter which has a photovoltaic cell for converting the energy of solar radiation of a particular range of wavelengths to electricity and which has a thermal heat absorber spaced from the cell which converts solar radiation of longer wavelengths passing from the cell to useful heat.

A method of utilizing solar energy comprising the step of subjecting a photovoltaic cell to solar radiation to convert energy of a particular range of wavelengths to which the cell is sensitive to electricity and transferring long wave radiations passing from a cell to a heat absorber spaced from the cell where the energy of the long wave radiation is transferred to useful heat.

5 Claims, 5 Drawing Figures

Silicon Cell Spectral Response

COMBINED SOLAR CONVERSION

TECHNICAL FIELD

The invention relates to a combined solar converter which has a photovoltaic cell for converting the energy of solar radiation of a particular range of wavelengths to electricity and which also has a thermal heat absorber which converts solar radiation of longer wavelengths to which the photovoltaic cell is insensitive to useful heat. The invention also relates to a method of utilizing solar energy comprising the steps of producing electricity from a photovoltaic cell which is sensitive to a particular range of solar radiation and of converting the energy of radiation of longer wavelengths to which the cell is insensitive to useful heat.

BACKGROUND ART

Photovoltaic cells utilizing semiconductor crystals for converting solar radiation to electricity are well known in the art and include many different kinds of crystalline or non-crystalline materials for accomplishing this purpose. A crystal which is widely used at present is silicon which is known to be most sensitive to wavelengths in the range of 0.6–0.9 micrometers and where the theoretical efficiency of the silicon crystal in converting the energy of radiation of such wavelengths to electricity is on the order of 50%. Other crystals, for example aluminium gallium arsenide, have been used for converting the energy of solar radiation to electricity and which have a range of wavelength sensitivity in the order of 1.6 micrometers for most efficient operation. As the photovoltaic cells, used to date, because of their relatively narrow range of sensitivity, effectively convert only a small part of the energy of the solar spectrum to electricity it has been proposed to combine solar cells which are sensitive to different parts of the solar spectrum to increase the effective amount of the solar spectrum converted. For example, it has been proposed to combine in a solar converter a silicon cell with an aluminium gallium arsenide cell and to utilize a filter to split the solar spectrum into areas and ranges which come within the sensitive range of each cell.

In still a further attempt to utilize more of the solar spectrum for conversion purposes, it has been proposed to shift radiation of shorter wavelengths to longer wavelengths in order to come within the particular range of sensitivity for a particular cell. In this instance, which is known as thermophotovoltaic conversion, the solar rays are shifted to longer wavelengths by a tungsten radiator which is heated to approximately 2000° C., with unused infrared energy passing through the silicon cell being recycled back to the radiator to help heat the same.

None of the attempts to increase the conversion of solar radiation to useful energy as far as I am aware however have been directed to utilizing the energy of the radiation of longer wavelengths to which the photovoltaic cell is insensitive where this energy is transferred to a heat absorber spaced from the cell. It is therefore an object of my invention to provide an apparatus and method whereby the energy of radiations of longer wavelengths to which a photovoltaic cell is insensitive may be converted to useful heat energy by a solar thermal absorber.

DISCLOSURE OF INVENTION

Broadly, the invention comprises a method of utilizing solar energy including a step of subjecting a photovoltaic cell sensitive to a particular range of wavelengths to a source of solar energy to produce electricity and the additional step of transferring radiations of longer wavelengths than to which the cell is sensitive to a heat absorber where the energy of the longer wave radiations is converted to useful heat. The step of transferring radiations of longer wavelengths may include reflecting the long wave radiations from the surface of the cell to the heat absorber in one form of the invention, and in a further form of the invention, may utilize a cell which is transparent to long wave radiations which pass through the cell and which are then directed to the heat absorber. In addition the method may include the additional step of shifting short wave radiations below that to which the cell is sensitive to longer wave radiations within the particular range of sensitivity by means of an optical shifting device to increase the amount of the solar spectrum subject of conversion to electricity. The method may still further include steps for repeatedly passing radiation through the photovoltaic cell in order to entrap an increased amount of photons within the cell for conversion to electricity.

The apparatus according to the invention broadly comprises a combined solar converter which has a photovoltaic cell and a heat absorber spaced from the cell so as to provide necessary space for an adequate converter configuration. The photovoltaic cell is sensitive to solar radiation of a particular range of wavelengths and means are provided for transferring radiation of longer wavelengths than the particular range to a heat absorbing element where the energy of the longer wave radiations may be converted to heat. The transfer means may include a reflective surface on the cell which is effective to reflect longer wave radiations to the absorber. In a further form of the invention the cell may be transparent to long wave radiations which then are directed to the absorber after passing through the cell.

A further form of the invention contemplates the solar converter having optical wavelength shifting means for shifting radiations of shorter wavelengths to longer wavelengths so as to come within the particular range of wavelengths to which the photovoltaic cell is sensitive in order to increase the amount of the solar spectrum converted to electricity.

A still further form of the invention comtemplates a combined solar cell converter having a photovoltaic cell which is transparent to long wave radiations and which includes a wavelength shifting and reflecting means whereby radiations of the particular range passing through the cell and which are not converted to electricity as well as shorter wave radiations have their wavelengths increased and reflected back to the cell such that radiations within the particular range again pass through the cell to be converted to electricity. In addition, a further reflector means may be included on the opposite side of the cell from the combined wavelength shifting and reflecting means to again reflect back to the cell any radiation passing through the cell for further conversion to electricity and for further transferring of long wave radiations to the absorber.

BEST MODE FOR CARRYING OUT THE INVENTION

Figure 1:
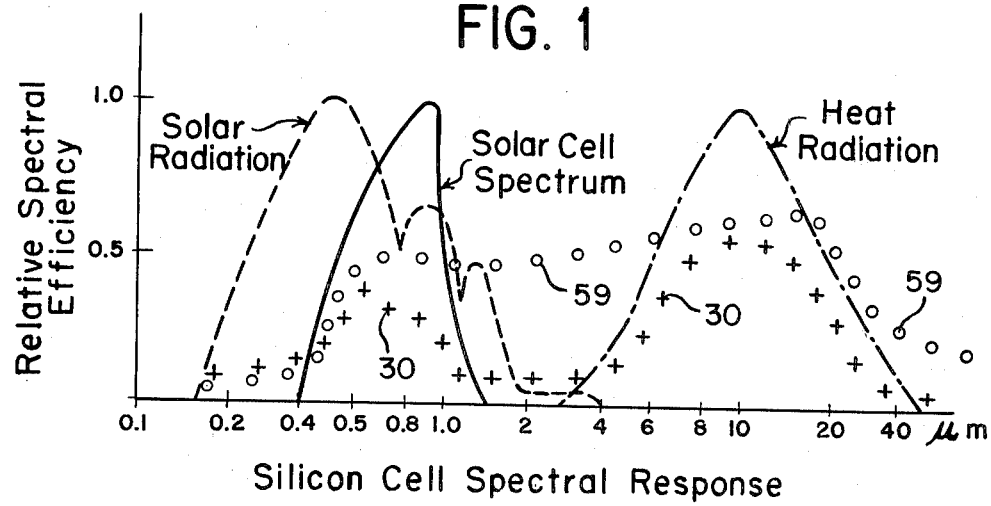
FIG. 1 is a graph representing relative efficiency of a silicon solar cell conversion, representing solar and heat radiation and representing relative power response of several embodiments of a combined solar converter constructed according to the invention, all as functions of wavelength.

Referring to FIG. 1, the relative efficiency of a silicon solar cell conversion of radiation into electricity as a function of wavelength is illustrated, with the cell being most sensitive to radiation in wavelengths in a particular range of 0.6–0.9 micrometers and where the theoretical efficiency of such conversion is on the order of 50%. As shown, much of the solar radiation is in the area of wavelengths shorter than the particular sensitivity range for silicon while solar heat radiation is in the area of wavelengths longer than the particular range. Photo cells comprised of other materials would have a different solar cell spectrum, as for example, aluminium gallium arsenide which is most efficient in the range of 1.6 micrometers. Thus it becomes apparent that when a solar cell alone is used in a solar converter, that much of the energy of the solar spectrum is ineffective for the conversion of solar energy into useful energy. Thus if the shorter and longer wavelengths of the solar spectrum besides the wavelengths falling within the particular range of sensitivity of the silicon could be converted, the overall efficiency of a solar converter would be increased.

Figure 2:
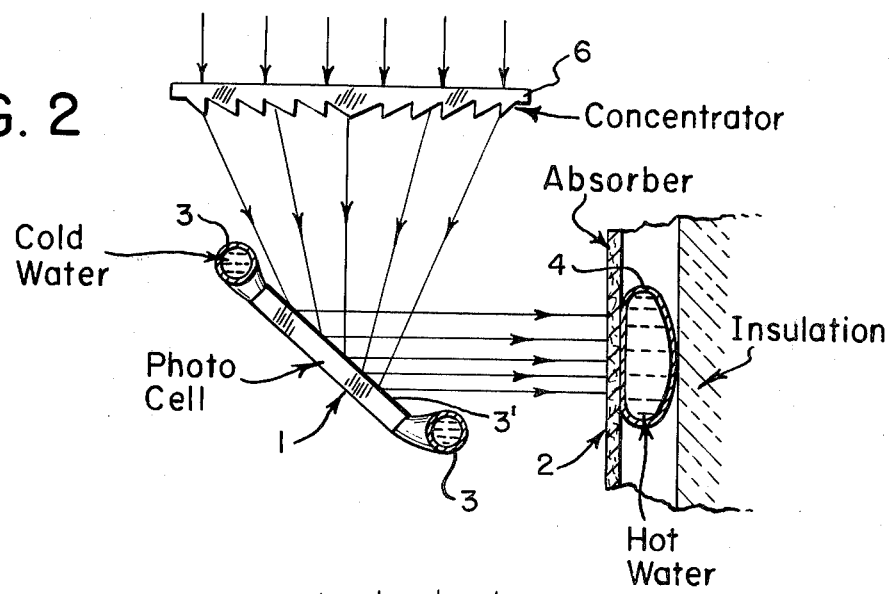
FIG. 2 is a diagrammatic view of a combined solar converter constructed according to the invention wherein a photovoltaic cell has a reflective surface for transferring long wave radiations to a heat absorber.

Referring to FIG. 2, there is illustrated a combined solar converter construction including a silicon photovoltaic cell 1 and a heat absorber 2 which is spaced from the cell. The cell 1 is cooled by cold water conduits 3 in order to increase the efficiency of the conversion of radiation energy to electricity. The heat absorber 2 preferably is coated with an anodized dendritic tungsten coating in order to retain heat and thus is non-transparent or opaque to the visible spectrum. The absorber 2 in turn contacts a water conduit 4 which forms part of a hot water grid, not shown. A concentrator in the form of a Fresnel-type lens 6 is provided for concentrating incident solar rays onto the cell 1. The cell 1 in turn has an outer reflective surface 3' by which some of the radiation of wavelengths longer than the particular range of wavelengths to which the cell is sensitive and the energy of which is not converted into electricity is transferred to the heat absorber 2 where the energy of the radiation is converted to heat which is then carried off by the hot water conduit 4 to the heating grid. The reflective surface may be obtained by coating the cell with a reflective material or by utilizing reflective properties of any encapsulation material surrounding the cell.

Some of the radiation coming from the concentrator 6 and falling into the cell 1 is converted to heat at the photo cell and this heat is carried off by the cold water conduits 3 which may also connect with the heating grid, not shown, in order that the heat produced by the cell may be utilized. Thus the combined solar converter of FIG. 2, in addition to converting solar radiation to electricity, also converts a good part of the radiation to useful heat both by the conversion of long wave radiation to useful heat by the absorber and also by the heating of the water used to cool the cell.

Figure 3:
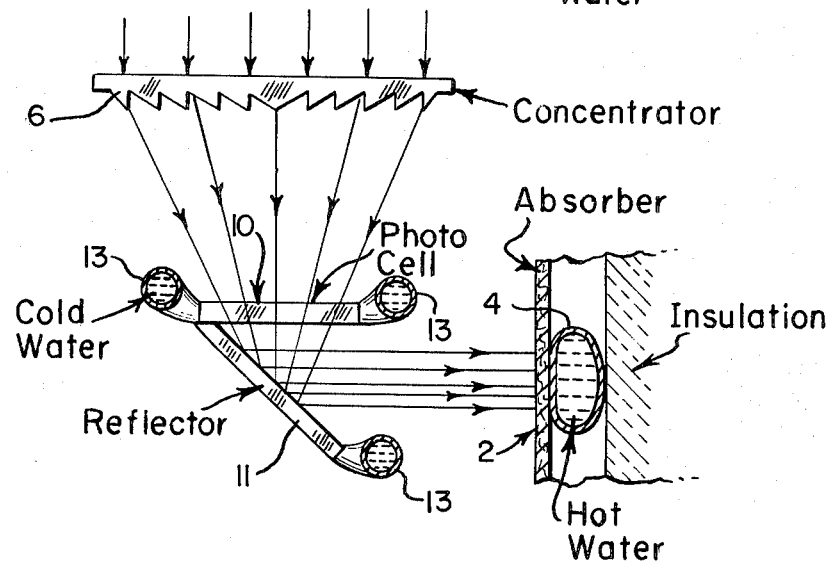
FIG. 3 is a diagrammatic view of a further embodiment of a combined solar converter constructed according to the invention wherein the photovoltaic cell is transparent to long wave radiations which are then transferred to a heat absorber.

Referring to FIG. 3, the photo cell 10 of the combined converter shown differs from that of FIG. 2 in that it has a non-reflective outer surface and in that the cell is transparent to radiations having wavelengths longer and shorter than the particular range. A reflector 11 is provided on the side opposite the cell from the source of radiation for reflecting the radiation occurring in the particular range which passes through the cell and which is not converted to electricity and for further reflecting radiation of longer wavelength than the particular range which passes through the photo cell onto the heat absorber 2. In this instance the reflector 11 serves as a transfer means for transferring radiation to the absorber. The outer surface of the cell can be made non-reflective by inclusion of anti-reflective coatings, selective etching or a combination of both. Cold water conduits 13 connected to a heat grid, not shown, serve to cool both the cell 10 and the reflector 11.

Referring to FIG. 1, the transmitting characteristic or relative power response of the combined solar converter of FIG. 3 as it varies with wavelength is illustrated. As shown by line 30, incoming radiation is converted to electricity at shorter wavelengths while the radiation reflected by the reflector 11 onto the absorber 2 is converted to heat at longer wavelengths. Thus as with the solar converter of FIG. 2, the converter converts solar radiation into electricity by the cell 10 and, in addition, converts radiation into useful heat by the absorber 2 and by the heating of the cooling water used to cool the cell and the reflector.

Figure 4:
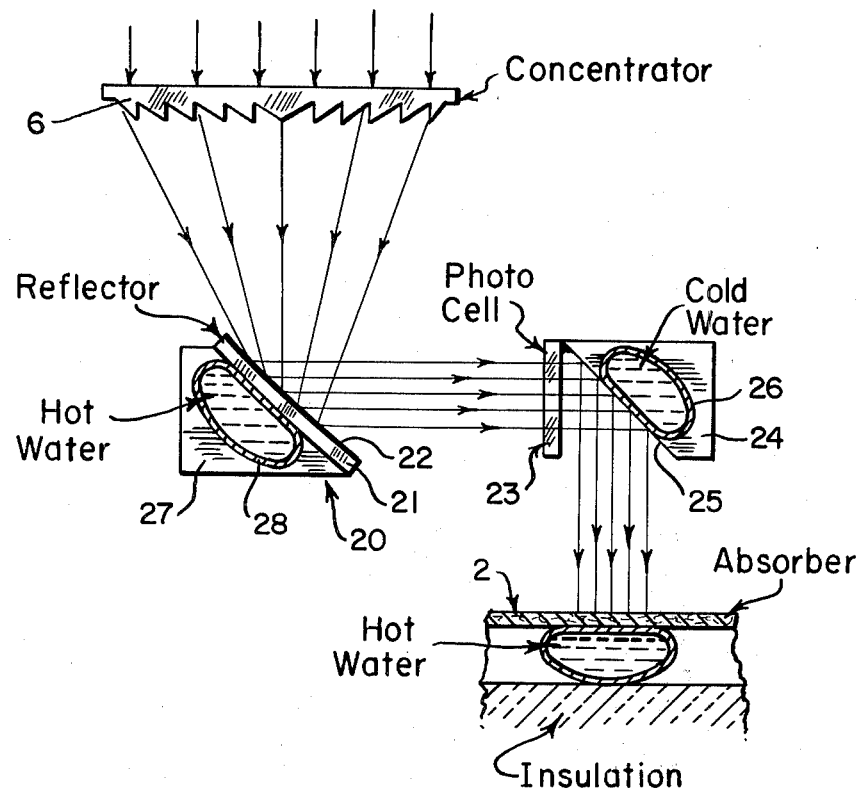
FIG. 4 is a diagrammatic view of a further embodiment of a combined solar converter constructed according to the invention utilizing means for shifting shorter wave radiations to longer wave radiations prior to the radiations impinging on the photovoltaic cell.

FIG. 4 illustrates a combined solar converter including an optical wavelength shifting means 20 comprising a glass surface 21 which is coated with a wavelength increasing reflective material 22, for example, doped indium oxide, which serves to increase the wavelength of the solar radiations coming from the Fresnel lens concentrator 6. The reflective surface reflects the waves onto the photovoltaic cell 23 mounted on a carrying member 24 which has a reflective surface 25 which in turn reflects radiation passing through the cell 23 onto the absorber 2. Carrying member 24 includes a cold water conduit 26 utilized to cool the cell 23 and which connects with a hot water grid, not shown, in the same manner as the cold water conduits in the embodiments of FIGS. 2 and 3.

In addition, the glass surface 21 is mounted on a carrying member 27 containing a hot water conduit 28 which is heated by long wave radiations impinging onto the wavelength shifting means member and which leads to the hot water grid. The cell 23 is transparent to long wave radiations above the particular range of sensitivity of the cell and to those radiations falling within the particular range the energy of which is not converted to electricity by the cell.

Figure 5:
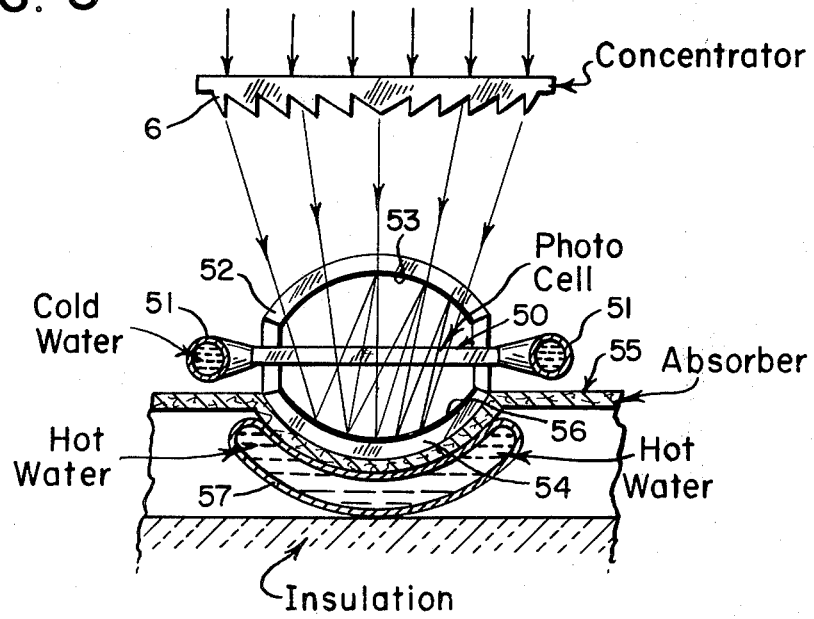
FIG. 5 is a diagrammatic view of a further embodiment of a combined solar converter constructed according to the invention, illustrating means for repeatedly passing radiation through a photovoltaic cell.

The optical wavelength shifting means 20, besides changing the wavelength, further acts in conjunction with the concentrator lens 6 to focus and reflect solar radiation on to the cell 23. The lengthening of solar radiation wavelengths by the optical wavelength shifting means 20 serves to match the solar radiation with the solar cell spectrum as shown in FIG. 1 by effectively moving the solar radiation to the right. The result is that the transmitting characteristic or relative power response of the combined solar converter is vastly improved as shown by line 30 of FIG. 1. This shifting of the radiation spectrum to fit with the cell spectrum in order to increase efficiency differs from the thermophotovoltaic concept as previously discussed in that radiation of shorter wavelengths is being shifted to radiation of longer wavelengths, the energy of which is then converted. In the thermophotovoltaic concept utilizing an intermediate hot radiator, the energy of radiation of shorter wavelength is lost and not converted. FIG. 5 illustrates a further embodiment of a combined solar converter in which solar rays are to a great extent trapped within the converter and reflected through the photovoltaic cell a number of times to assure maximum conversion of radiation energy to electrical energy. The cell 50 of FIG. 5, like the cells of FIGS. 2 and 3, has cold water conduits 51 leading to a heating grid, not shown. The cell 50 in addition has glass covers 52 and 54 positioned on either side of the cell with the cover 52 having a reflective surface 53 on the side facing the cell and the cover 54 having a reflective surface 56 on the side facing the cell and with the cover 54 being in contact with a heat absorber 55. Both reflective surfaces preferably are coated with a doped indium oxide coating so that they also may act as a wavelength shifting means similar to that of FIG. 4 with the cover 52 acting as a first optical wavelength shifting means and the cover 54 acting as a second optical wavelength shifting means.

A hot water conduit 57 contacts the absorber 55 and leads to a heating grid, not shown, to which the conduits 51 are also connected.

As shown in FIG. 5, solar radiation coming from the concentrator passes through cover 52 where radiation of shorter wavelengths is lengthened to come within the particular range of sensitivity of cell 50 and then impinges upon the cell 50. Some of the radiation within the particular range is converted into electricity by the cell 50 while the part not converted, along with radiations of longer and shorter wavelengths, than the particular range, pass through the cell to impinge upon the coating 56 where radiation of longer wavelength greater than the particular range is converted to heat. The wavelengths of some of the radiation passing through the cell are increased and reflected back again through the cell 50 where radiation falling within the particular range may again be converted to electricity and any of the remaining radiation then passed onto the reflective surface 53 which again redirects the radiation back to the cell 50 while at the same time increasing wavelengths where again some of the radiation is converted to electrical energy. The radiation of long wavelengths to which the cell 50 is not sensitive will be converted to heat energy by the absorber. The effect of this construction is that much more of the solar radiation falling within the particular range is converted to useful electricity.

The improved conversion characteristic of the combined solar converter of FIG. 5 is represented in FIG. 1 by the line 59 where it is seen that the efficiency of solar radiation converted to electricity is substantially greater than that of the embodiment of FIG. 4.

While I have illustrated embodiments of the combined converter in diagrammatical form, it is obvious that the converter can be assembled in solar installations in a number of ways to assure maximum exposure to the solar radiation during different parts of the day. For example, the embodiment of FIG. 2, wherein long wave radiation is reflected off the surface of a cell, may be used to line or pave mirror panels serving to direct or concentrate the solar radiation.

It is also obvious that different kinds of cells may be employed together in a converter according to the invention where the different cells are combined together to make up a single complex cell having multijunction areas in order to increase the range of wavelengths to which the complex cell is sensitive.

I claim:

1. A method of utilizing solar energy comprising the steps of (a) subjecting a photovoltaic cell to a source of solar radiation, said cell being sensitive to radiation of a particular range of wavelengths and insensitive and thus transparent to radiation of greater and shorter wavelengths than said radiation of particular range, thereby converting the energy of part of said radiation of particular range to electricity; (b) directing part of said radiation of greater and shorter wavelengths after they have passed through said cell to an energy absorber spaced from said cell to convert the energy of the same to heat; (c) shifting the wavelengths of any radiation that passes through the cell to longer wavelengths; and (d) reflecting the shifted radiation of longer wavelengths back towards said cell to produce electricity therefrom.

2. A method of utilizing solar energy according to claim 1 including the additional step of reflecting any shifted radiation of longer wavelengths that may pass through said cell back towards said cell.

3. A combined solar converter adapted to be exposed to a source of solar radiation, comprising a photovoltaic cell sensitive to solar radiation of a particular range of wavelengths so as to convert the energy of part of said radiation of particular range to electricity, wherein said cell is transparent and thus insensitive to solar radiation of shorter and longer wavelengths than said particular range, an energy absorber positioned to receive radiation of said longer wavelengths passing through said cell for converting the energy of the same to heat, a first optical wavelength shifting means positioned between the radiation source and said cell for shifting radiation of said shorter wavelengths to longer wavelengths to come within said particular range, and a second optical shifting means positioned on the opposite side of said cell from said first optical shifting means for shifting radiation passing through said cell into longer wavelengths and for reflecting the shifted radiation of longer wavelengths back towards said cell.

4. A combined solar converter according to claim 3 wherein said first optical shifting means has a reflective surface for shifting radiation reflected from said second optical shifting means and passing through said cell back towards said cell.

5. A combined solar converter adapted to be exposed to a source of solar radiation, comprising a photovoltaic cell sensitive to solar radiation of a particular range of wavelengths so as to convert the energy of part of said radiation of particular range to electricity, wherein said cell is transparent and thus insensitive to solar radiation of shorter and longer wavelengths than said particular range, an energy absorber spaced from said cell and positioned to receive radiation of shorter and longer wavelengths passing through said cell for converting the energy of the same to heat, and optical wavelength shifting means comprising a glass surface coated with doped indium oxide positioned between the radiation source and the cell for shifting radiation of shorter wavelengths to longer wavelengths to come within said particular range.

* * * * *